United States Patent

Chung

[11] Patent Number: 5,881,800
[45] Date of Patent: Mar. 16, 1999

[54] HEAT SINK FASTENER

[76] Inventor: Kuang-Hua Chung, No. 26, Lane 116, Ta-Tao St., Hsihu Town, Changhua County, Taiwan

[21] Appl. No.: 54,265

[22] Filed: Apr. 3, 1998

[51] Int. Cl.[6] ...................................................... F28F 7/00
[52] U.S. Cl. ..................... 165/80.3; 165/185; 257/727; 257/717; 257/718; 24/575; 24/458; 24/457; 248/316.7; 361/719; 361/710; 361/707
[58] Field of Search ................. 165/80.3, 80.2, 165/185; 257/718, 719, 727; 361/704, 707, 709, 710, 703, 719, 718, 717; 174/16.3; 24/458, 457, 575; 248/316.1, 316.7

[56] References Cited

U.S. PATENT DOCUMENTS

| | | | |
|---|---|---|---|
| 4,933,746 | 6/1990 | King | 257/718 |
| 5,304,735 | 4/1994 | Earl et al. | 257/718 X |
| 5,375,652 | 12/1994 | Matsunaga et al. | 257/718 X |
| 5,381,305 | 1/1995 | Harmon et al. | 257/718 X |
| 5,436,798 | 7/1995 | Wieland, Jr. | 257/719 X |
| 5,699,229 | 12/1997 | Brownell | 257/719 X |
| 5,730,210 | 3/1998 | Kou | 257/719 X |

*Primary Examiner*—Ira S. Lazarus
*Assistant Examiner*—Christopher Atkinson
*Attorney, Agent, or Firm*—Rosenberg, Klein & Bilker

[57] ABSTRACT

A heat sink retainer fastened to a heat sink and a mother board to hold the heat sink on a CPU above the mother board, the heat sink having two vertical retaining walls clamped on a curved fin of the heat sink at two horizontally spaced opposite sides, a top wall and a bottom wall clamped on the curved fin of the heat sink at two vertically spaced opposite sides, a vertical back wall stopped at one end of the curved fin of the heat sink, and an arrowhead locating bolt downwardly extended from the bottom wall and fastened to one locating hole on the mother board to secure the heat sink retainer to the mother board.

2 Claims, 4 Drawing Sheets

HEAT SINK FASTENER

BACKGROUND OF THE INVENTION

When an IC or CPU which is mounted on a mother board is operated, it produces heat. In order to prevent the IC or CPU from being burned out, heat must be quickly carried away during the operation of the IC or CPU. Heat sink and electric fan are commonly used for this purpose. FIG. 1 shows a heat sink mounting arrangement according to the prior art. As illustrated, the heat sink 12 is closely attached to the top side wall of the CPU 11 above the mother board 10, and screws 13 are mounted in corner mounting holes 121 on the heat sink 12 and threaded into respective screw holes 101 on the mother board 10 to secure the heat sink 12, the CPU 11 and the mother board 10 together. This heat sink mounting arrangement has drawbacks as follows:

1. It is complicated to process holes on the heat sink and screw holes on the mother board. The procedure of using screws to fasten the heat sink to the mother board is also complicated.
2. The inner threads of the screw holes wear quickly with use. The screws become loosened when the inner threads of the screw holes are damaged, thereby causing the heat sink unable to be closely attached to the surface of the CPU.
3. Because the screws are rigid elements and fastened to the heat sink in four corners, heat cannot be effectively transmitted from the CPU to the heat sink when the mother board deforms.

SUMMARY OF THE INVENTION

The present invention has been accomplished to provide a heat sink retainer for fastening a heat sink to a mother board which eliminates the aforesaid drawbacks. According to the present invention, the heat sink retainer comprises two vertical retaining walls clamped on a curved fin of the heat sink at two horizontally spaced opposite sides, a top wall and a bottom wall clamped on the curved fin of the heat sink at two vertically spaced opposite sides, a vertical back wall stopped at one end of the curved fin of the heat sink, and an arrowhead locating bolt downwardly extended from the bottom wall and fastened to one locating hole on the mother board to secure the heat sink retainer to the mother board. The heat sink retainer is preferably injection-molded from plastics to minimize its manufacturing cost.

DETAILED DESCRIPTION OF THE PREFERRED EMBODIMENT

Figure 1:
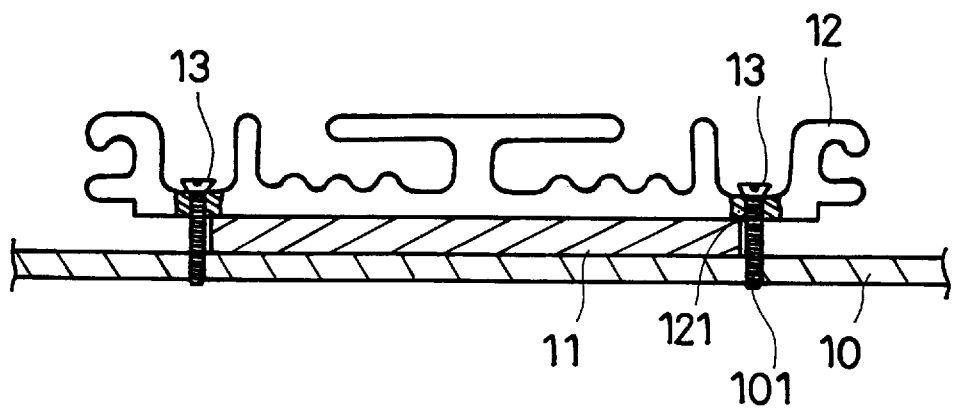
FIG. 1 is a plain view showing a heat sink attached to a CPU and secured to a mother board according to the prior art.
Figure 2:
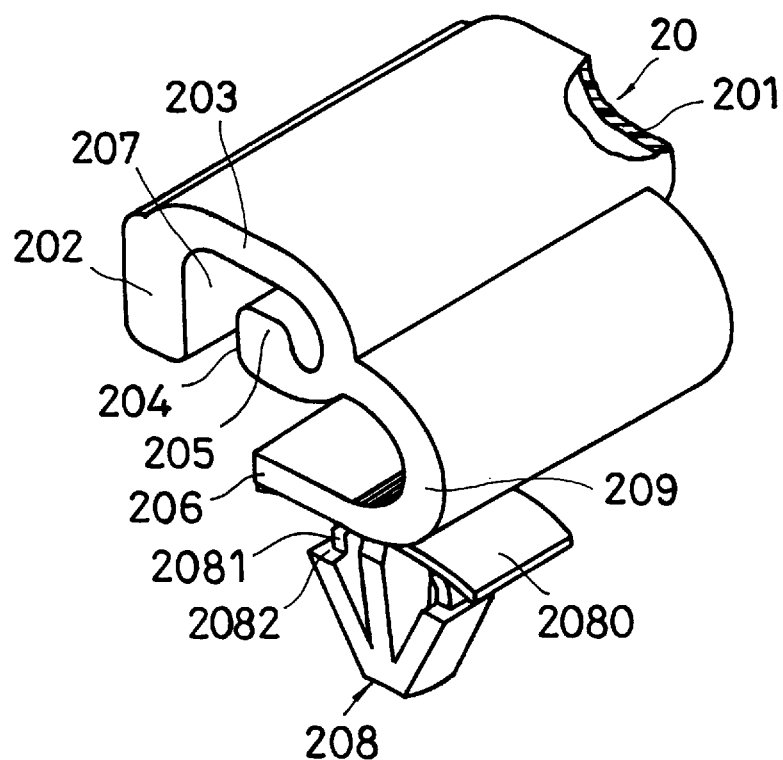
FIG. 2 is a perspective view of a heat sink retainer according to the present invention.

Referring to FIG. 2, a heat sink fastener 20 comprises a smoothly curved horizontal top wall 203, a vertical back stop wall 201 downwardly extended from the smoothly curved horizontal top wall 203 at right angles, a vertical outer retaining wall 202 downwardly extended from the smoothly curved horizontal top wall 203 and forwardly extended from the vertical back stop wall 201, a smoothly arched bottom clamping wall 206 extended outwardly downwards from one side of the smoothly curved horizontal top wall 203 and turned inwards toward the vertical outer retaining wall 202 at an elevation lower than the vertical outer retaining wall 202, a vertical inner retaining wall 204 inwardly extended from the connecting area between the smoothly curved horizontal top wall 203 and the smoothly arched bottom clamping wall 206, the vertical inner retaining wall 204 having a top edge 205 spaced from the smoothly curved horizontal top wall 203 at a distance, a mounting groove 207 defined between the vertical outer retaining wall 202 and the vertical inner retaining wall 204 below the smoothly curved horizontal top wall 202, a downwardly extended arrowhead locating bolt 208 having a neck 2081 downwardly extended from the smoothly arched bottom clamping wall 206 and two symmetrical pairs of shoulders 2082, and two horizontal wings 2080 bilaterally extended from the connecting area between the arrowhead locating bolt 208 and the smoothly arched bottom clamping wall 206 in reversed directions.

Figure 3:
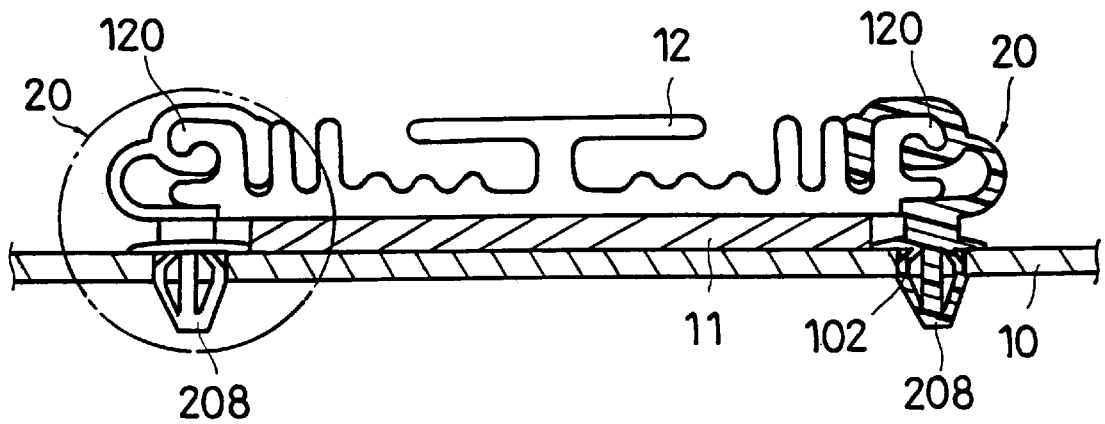
FIG. 3 is an applied view of the present invention, showing the heat sink retainer fastened to the CPU and the mother board.
Figure 3A:
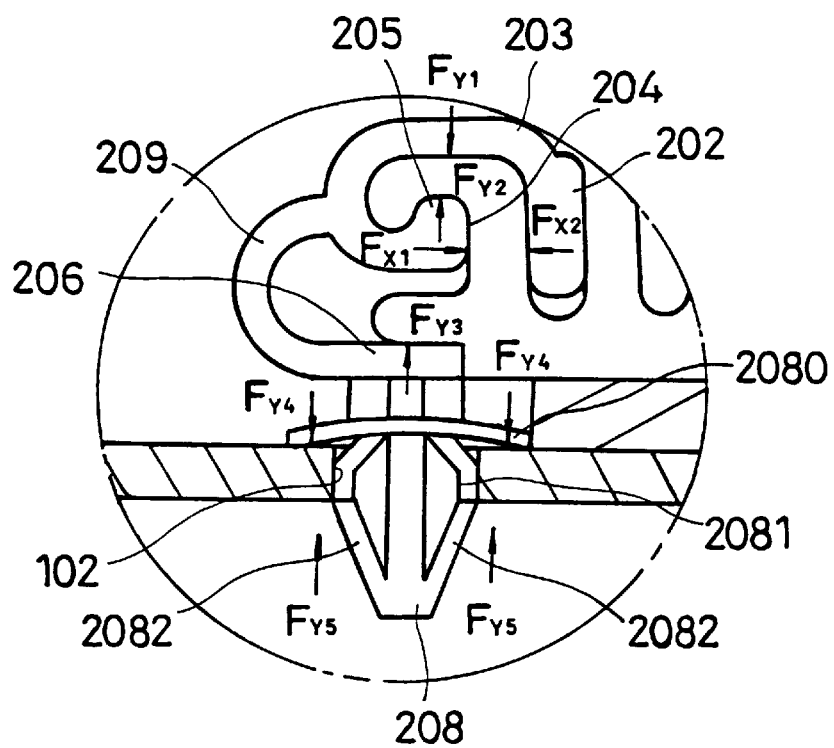
FIG. 3A is an enlarged view of a part of FIG. 3.
Figure 4:
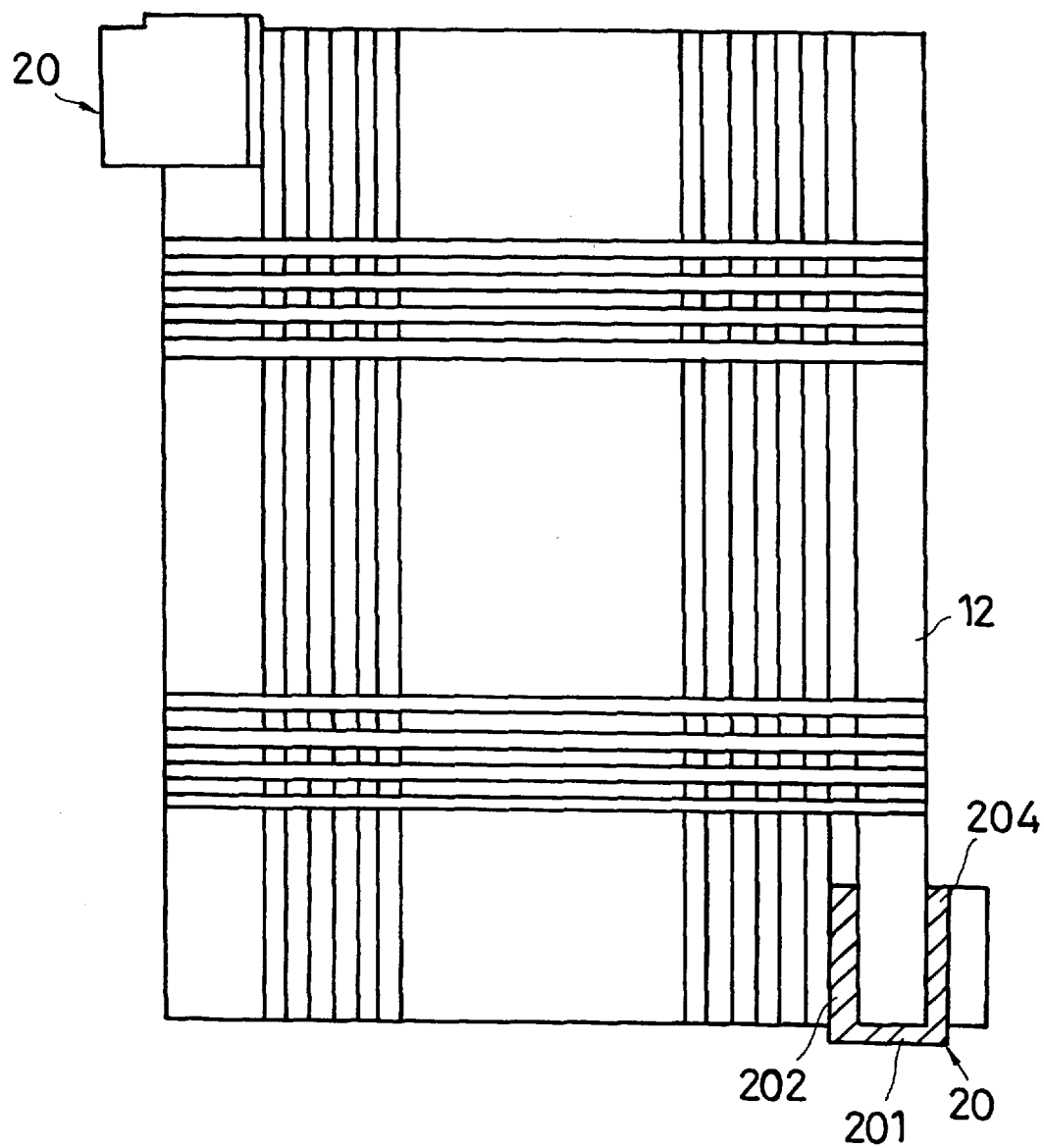
FIG. 4 is a top plain view of FIG. 3.

Referring to FIGS. 3, 3A and 4, the heat sink fastener 20 is fastened to a mother board 10 and a heat sink 12 in one corner to secure the mother board 10 and the heat sink 12 together, permitting a CPU 11 to be firmly retained between the heat sink 12 and the mother board 10. During installation, the mounting groove 207 is forced into engagement with one curved fin 120 of the heat sink 12. permitting the vertical portion of the curved fin 120 to be retained between the vertical outer retaining wall 202 the vertical inner retaining wall 204 and the horizontal portion of the curved fin 120 to be retained between the top edge 205 of the vertical inner retaining wall 204 and the smoothly curved horizontal top wall 203, and permitting the vertical back wall 201 to be stopped at one end of the curved fin 120 and the bottom clamping wall 206 to be clamped on the bottom side wall of the heat sink 12. After the heat sink retainer 20 and the heat sink 12 have been fastened together, the heat sink 12 is closely attached to the top wall of the CPU 11 on the mother board 10, and at the same time, the arrowhead locating bolt 208 is plugged into one locating hole 102 on the mother board 10, permitting the neck 2081 to be retained in the locating hole 102, the horizontal wings 2080 to be stopped at the top wall of the mother board 10, and the shoulders 2082 to be forced into engagement with the bottom wall of the mother board 10.

Referring to FIG. 3A again, when installed, the top wall 203 and the top edge 205 of the vertical inner retaining wall 204 impart a downward pressure FY1 and an upward pressure FY2 to hold down the horizontal portion of the curved fin 120 of the heat sink 12; the horizontal wings 2080 and the shoulders 2082 impart a downward pressure FY4 and an upward pressure FY5 to hold down the mother board 10; the vertical outer retaining wall 202 and the vertical inner retaining wall 204 impart an inward pressure to the curved fin 120 of the heat sink 12 from both sides to hold down the curved fin 120; the bottom clamping wall 206 imparts an upward pressure to the bottom wall of the heat sink 12 against the downward pressure from the horizontal top wall 203, causing the heat sink retainer 20 to be firmly secured to the heat sink 12.

While only one embodiment of the present invention has been shown and described, it will be understood that various modifications and changes could be made thereunto without departing from the spirit and scope of the invention disclosed.

What the invention claimed is:

1. A fastener for retaining against an integrated circuit chip mounted to a motherboard a heat sink device formed with a fin structure, said fastener comprising:

(a) a first section for securely engaging said fin structure, said first section having formed thereon opposed vertical outer retaining wall and vertical inner retaining wall portions and a horizontal top wall portion extending therebetween to define a mounting groove for receiving a portion of said heat sink device fin structure, said retaining and top wall portions being adapted to cooperatively capture said heat sink device fin structure received in said mounting groove;

(b) a second section adapted to lockingly engage a locating hole of said motherboard, said second section having a longitudinally extending arrowhead locating bolt portion, said arrowhead locating bolt portion including a plurality of wing projections laterally projecting therefrom for engaging a top surface of said motherboard, a plurality of shoulder projections for engaging a bottom surface of said motherboard, and a neck portion extending longitudinally therebetween; and, (c) a third section extending between said first and second sections, said third section including a substantially arcuate bottom clamping wall portion adapted to engage a portion of said heat sink device fin structure external to said mounting groove.

2. The fastener as recited in claim 1 wherein said first section includes a vertical back stop wall portion extending transversely from said horizontal top wall portion to terminate said mounting groove.

\* \* \* \* \*